(12) United States Patent
Krouk et al.

(10) Patent No.: US 8,015,468 B2
(45) Date of Patent: Sep. 6, 2011

(54) CHANNEL ESTIMATION AND FIXED THRESHOLDS FOR MULTI-THRESHOLD DECODING OF LOW-DENSITY PARITY CHECK CODES

(75) Inventors: Evguenii A. Krouk, Saint Petersburg (RU); Andrey Vladimirovich Belogolovy, Saint Petersburg (RU); Andrey Gennadievich Efimov, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 1193 days.

(21) Appl. No.: 11/664,203

(22) PCT Filed: Dec. 29, 2004

(86) PCT No.: PCT/RU2004/000536
§ 371 (c)(1),
(2), (4) Date: Mar. 29, 2007

(87) PCT Pub. No.: WO2006/073324
PCT Pub. Date: Jul. 13, 2006

(65) Prior Publication Data
US 2008/0086670 A1 Apr. 10, 2008

(51) Int. Cl.
*H03M 13/00* (2006.01)
(52) U.S. Cl. .................. 714/752; 714/749; 714/794
(58) Field of Classification Search .................. 714/752, 714/749, 780, 704, 746, 794, 763
See application file for complete search history.

(56) References Cited

U.S. PATENT DOCUMENTS

| | | | |
|---|---|---|---|
| 3,806,883 A | | 4/1974 | Weisbecker |
| 4,295,218 A | | 10/1981 | Tanner |
| 5,467,132 A | | 11/1995 | Fazel et al. |
| 5,550,837 A | * | 8/1996 | Chang .......................... 714/708 |
| 5,691,992 A | | 11/1997 | Molnar et al. |
| 6,031,874 A | | 2/2000 | Chennakeshu et al. |
| 6,292,917 B1 | | 9/2001 | Sinha et al. |
| 6,363,513 B1 | * | 3/2002 | Hekstra .......................... 714/786 |
| 6,543,025 B2 | * | 4/2003 | Hekstra .......................... 714/774 |

(Continued)

FOREIGN PATENT DOCUMENTS

RU 2146850 3/2000
(Continued)

OTHER PUBLICATIONS

"International Search Report for corresponding PCT Application No. PCT/RU2004/000123", (Jan. 31, 2005),6 pgs.

(Continued)

*Primary Examiner* — Fritz Alphonse
(74) *Attorney, Agent, or Firm* — Schwegman, Lundberg & Woessner, P.A.

(57) ABSTRACT

A method and apparatus are provided for error correction of a communication signal. A multiple fixed threshold scheme for iteratively decoding a received codeword includes making a comparison with a threshold to generate a reconstructed version of the received codeword. The threshold has at least two different values that at used during different iterations. The values of the threshold are fixed having been determined prior to decoding. In an embodiment, the fixed thresholds may be based on values for channel parameters and may be selected by a decoder that receives information regarding the channel parameter from a channel estimation unit monitoring the communication channel. Embodiments include decoding methods and apparatus using a threshold having two of more fixed values during the iterative decoding.

40 Claims, 4 Drawing Sheets

U.S. PATENT DOCUMENTS

| | | | |
|---|---|---|---|
| 6,614,858 | B1 | 9/2003 | Pekarich et al. |
| 6,633,856 | B2 | 10/2003 | Richardson et al. |
| 6,665,831 | B1 | 12/2003 | Yoshida et al. |
| 6,694,474 | B2 | 2/2004 | Ramprashad et al. |
| 6,771,772 | B1 | 8/2004 | Tanrikulu |
| 6,854,082 | B1 | 2/2005 | Rhee |
| 7,190,732 | B2 | 3/2007 | Chung et al. |
| 7,373,581 | B2 * | 5/2008 | Okamura et al. ............. 714/752 |
| 7,716,561 | B2 | 5/2010 | Belogolovyi et al. |
| 2007/0011586 | A1 | 1/2007 | Belogolovyi et al. |
| 2007/0271496 | A1 | 11/2007 | Krouk et al. |
| 2008/0086672 | A1 | 4/2008 | Ovchinnikov et al. |

FOREIGN PATENT DOCUMENTS

| | | |
|---|---|---|
| SD | 985959 | 12/1982 |
| TW | 200412722 A | 7/2004 |
| WO | WO-03063135 A1 | 7/2003 |
| WO | WO-2005096509 A1 | 10/2005 |
| WO | WO-2006073322 A1 | 7/2006 |
| WO | WO-2006073324 A1 | 7/2006 |
| WO | WO-2006075929 A1 | 7/2006 |
| WO | WO-2006130033 A1 | 12/2006 |

OTHER PUBLICATIONS

"Written Opinion of the International Searching Authority for the corresponding PCT Application No. PCT/RU2004/000123", (Jan. 31, 2005),10 pgs.

"International Search Report for corresponding PCT Application No. PCT/RU2004/000536" published as WO 2006/073324 on Jul. 13, 2006. 4 pgs.

"Written Opinion of the International Searching Authority for the corresponding PCT Application No. PCT/RU2004/000536", published as WO 2006/073324 on Jul. 13, 2006. 6 pgs.

Deenick, Karl R., "Turbo Codes and Low-Density Parity-Check Codes", *University of Sydney, ELEC5505—Advanced Digial Transmission*, (Oct. 2001), 1-7.

Djurdjevic, Ivana , "A class of low-density parity-check codes constructed based on Reed-Solomon codes with two information symbols", *IEEE Communications Letters*, 7(7), (Jul. 2003),317-319.

Fossorier, Marc P., et al., "Reduced Complexity Iterative Decoding of Low-Density Parity Check Codes Based on Belief Propagation", *IEEE Transactions on Communications*, Vo. 47, No. 5, (May 1999),673-680.

Gallager, R. G., "Low-Density Parity-Check Codes", *IRE Transactions on Information Theory*, (Jan. 1962),21-28.

Hu, Xiao-Yu , et al., "Regular and Irregular Progressive Edge-Growth Tanner Graphs", *Submitted to IEEE Transactions on Information Theory*, IBM Research, Zurich Research Laboratory,(2003),64 pgs.

Johnson, Sarah J., et al., "Low-density parity-check codes: Design and decoding", *Chapter in Wiley Encyclopedia of Telecommunications* (J. Proakis, Ed.), *Technical Report EE02041*, (Jun. 27, 2002),1-33.

Kou, Y , et al., "Low-density parity-check codes based on finite geometries: a rediscovery and new results", *IEEE Transactions on Information Theory*, 47(7), (Nov. 2001),2711-2736.

MacKay, D. J., et al., "Performance of Low Density Parity Check Codes as a Function of Actual and Assumed Noise Levels", *Electronic Notes in Theoretical Computer Science 74* (2003), URL: http://www.elsevier.nl/locate/entcs/volume74.html,8 pgs.

Mehta, Gayatri , et al., "An FPGA Implementation of the Graph Encoder-Decoder for Regular LDPC Codes", *Conmunications Research Laboratory Technical Report #8-4-2002-1*, Available from http://crl.ee.pitt.edu/technicalReports/CRL__August__2002. pdf,(Aug. 2002),1-18.

Neal, Radford M., "Sparse Matrix Methods and Probabilistic Inference Algorithms: Part I, Faster Encoding for Low Density Parity Check Codes Using Sparse Matrix Methods", *IMA Program on Codes, Systems and Graphical Models*, 1999, Available from http://www.ima.umn.edu/talks/workshops/aug2-13.99/1neal/neal. pdf,(Aug. 1999),16 pages.

Nouh, A. , et al., "Bootstrap Decoding of Low-Density Parity-Check Codes", *IEEE Communications Letters*, 6(9), (Sep. 2002),391-393.

Shokrollahi, Amin , "An Introduction to Low-Density Parity-Check Codes", *Theoretical Aspects of computer Science* (G.B. Khosrovshahi et al, eds.), LNCS 2292, Springer-Verlag Berlin Heidelberg, (2002),175-197.

Thorpe, Jeremy , "Code and Decoder Design for LDPC Codes for Gbps Systems", *Caltech student Powerpoint presentation to Microsoft Research*, Available from www.ee.caltech.edu/~jeremy/research/ presentations/LDPC-intro.ppt,(Nov. 25, 2002),33 pages.

Bokolamulla, D. , et al., "Reduced Complexity Iterative Decoding for Concatenated Coding Schemes", *Proc. IEEE International Conference on Communications (ICC '03)*, 1(5), (May 11, 2003),3135-3139.

Gallager, R. G., "Low-Density Parity Check Codes", *IRE Transactions on Information Theory*, (Jan. 1962),21-28.

Gilbert, E N., "A problem in binary coding", *In Proceedings of the Symposium in Applied Mathematics*, vol. 10, (1960),291-97.

Inaba, Y. , et al., "Performance of low density parity check (LDPC) codes with bootstrap decoding algorithm on a fast fading channel", *IEEE 59th Vehicular Technology Conference*, 2004. VTC 2004-Spring., (May 17-19, 2004),333-337.

Kousa, M. A., et al., "Multichannel Adaptive System", *IEEE Proceedings I. Solid-State & Electron Devices, Institution of Electrical Engineers*, 140(5) Part-I, (Oct. 1, 1993),357-364.

Krouk, E A., et al., "Low-density parity-check burst error-correcting codes", *In 2nd International Workshop Algebraic and combinatorial coding theory*, Leningrad, 1990.,121-124.

Kumar, V. , et al., "On Unequal Errol TProtection LDPC Codes Based on Plotkin-type Constructions", *Globecom 2004, Global Telecommunications Conference, IEEE Communications Society*, (Nov. 29, 2004),493-497.

Pukkila, M. , et al., "Turbo Equalization with Low Complexity Decoder", *Proceecings, IEEE 54th Vehicular Technology Conference (VTC' 2001)*, vol. 2, (Oct. 7, 2001),1048-1052.

Richardson, T. , et al., "The Renaissance of Gallager's Low-Density parity-Check Codes", *IEEE Communications Magazine*, 41(8), ISSN: 0163-6804,(Aug. 2003),126-131.

* cited by examiner

CHANNEL ESTIMATION AND FIXED THRESHOLDS FOR MULTI-THRESHOLD DECODING OF LOW-DENSITY PARITY CHECK CODES

RELATED APPLICATIONS

This application is a U.S. National Stage Filing under 35 U.S.C. 371 from International Patent Application Serial No. PCT/RU2004/000536, filed Dec. 29, 2004, and published on Jul. 13, 2006 as WO 2006/073324 A1, which is incorporated herein by reference. This application is related to the following, co-pending, commonly assigned application: PCT Application no. PCT/RU2004/000123, entitled: "MULTI-THRESHOLD RELIABILITY DECODING OF LOW-DENSITY PARITY CHECK CODES," filed 31 Mar. 2004.

TECHNICAL FIELD

Embodiments of the invention relate generally to error correcting in communication signals.

BACKGROUND

A communication channel, whether it is a fiber optic channel, a co-axial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits and in which a number of the bits are information (message) bits and a number of bits are used for error correction. A codeword having a length of n bits includes k bits for the message length of the code and r=n−k redundant bits. The r bits are for correction and may be r parity check bits. A parity check matrix, H, contains a set of parity check equations that define the codeword according to the relation:

$$HC^T = 0,$$

where C is the n-dimensional vector of the codeword bits. At a receiver if this relation is not satisfied, then the received codeword is not valid and must either be corrected or retransmitted.

A variety of schemes for decoding a codeword that has propagated through a communication channel exist. Some schemes may provide accuracy, and other schemes may provide fast decoding. In high speed data communication what is needed is a decoding scheme that is accurate and fast, but at the same time can be implemented without a significant amount of complexity.

DETAILED DESCRIPTION

Figure 1:
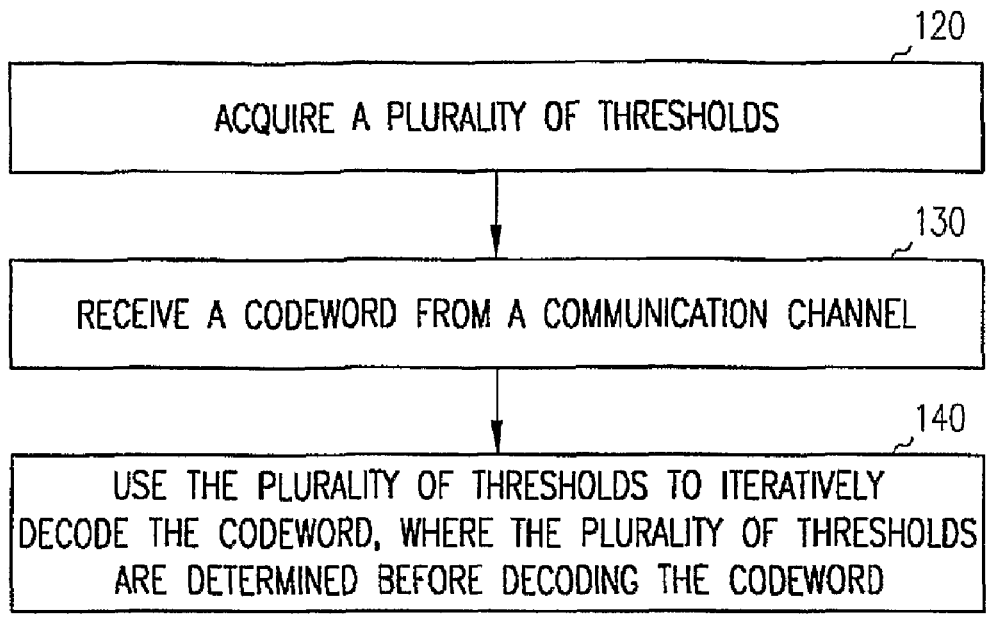
FIG. 1 shows a flow diagram of an embodiment of a method for iteratively decoding information received from a communication channel using a set of fixed thresholds.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some embodiments can be combined with one or more other embodiments to form new embodiments. The following detailed description is, therefore, not to be taken in a limiting sense, and the scope of the embodiments of the present invention is defined only by the appended claims, along with the full scope of equivalents to which such claims are entitled.

In various embodiments, data is provided by decoding codewords received from a communication channel. Decoding schemes employed may use thresholds in the decoding process. Thresholds in an iterative decoding process may be viewed as criteria against which a comparison may be made to control subsequent activities in the process. An embodiment includes a decoder having a multi-threshold decision scheme. By multi-threshold decision scheme, it is meant that a threshold value is changed to a computed value or a pre-defined value during one or more decoding iterations. In a multi-threshold decoder, the threshold may have different values during different iterative segments of the decoding process. Embodiments for decoding schemes and apparatus adapted to such schemes include application of a multi-threshold decoder using an adaptive threshold selection and a fixed threshold selection. In an embodiment, during the first iteration a maximum threshold value (by absolute value) is used and in following iterations, a change of threshold is applied in which the threshold decreases. Changing the threshold values allows the use of a high threshold value during the first iteration leading to an absence, or reduction, of error propagation. Thus, if the decoder corrects even a small number of errors, the decoding at following iterations becomes significantly easier. Use of an embodiment of the multi-threshold decoding scheme may lead to a decrease in the number of iterations made during decoding.

In an adaptive threshold selection, a threshold may be computed during each decoder iteration or may be computed in the first decoder iteration and then used in subsequent decoding iterations. In an adaptive threshold approach, the decoder needs no additional information about the parameters of the communication channel, such as noise dispersion, in which the signal carrying the codeword propagates.

Though an adaptive threshold selection scheme may operate independent of channel parameter characterization, decoders operating with an adaptive threshold selection use additional time during decoding to calculate thresholds, whether the decoder is software based or hardware based. Further, in a hardware implementation, a large number of elementary logic blocks may be used to perform the decoding.

In an embodiment for decoding using a fixed thresholds selection scheme, a decoder uses predefined thresholds. Usage of fixed thresholds decreases decoder complexity. The thresholds for a multi-threshold decoder are not constant and depend on a variety of parameters, such as channel signal-to-noise ratio, SNR, the code construction for generating the codeword, and the code length. Fixed values for a threshold may be selected separately for each codeword construction and code length. In an embodiment, the codeword may be realized as a low density parity check (LDPC) codeword.

In an embodiment, the functioning of a multi-threshold decoder in an additive white Gaussian noise (AWGN) channel is simulated for some channel parameter. A thresholds table is formed having one or more values for different values of the channel parameter. In an embodiment, information about the channel parameter is provided by a channel estimation unit configured in an active transmission architecture. The channel estimation unit and the multi-threshold decoder may be arranged to jointly decode codewords in a signal. In an embodiment, the channel estimation unit gives information about the channel parameter to the decoder, and the decoder selects a plurality of thresholds for the given channel parameter from the predefined thresholds table. Usage information about channel parameter values generates additional information to decoder, which increases the decoder performance. Further, usage of predefined thresholds table allows for the quick selection of threshold values based on channel conditions, which increases decoding speed without quality loss compared to an adaptive thresholds selection scheme.

FIG. 1 shows a flow diagram of an embodiment of a method for iteratively decoding data received from a communication channel using a set of fixed thresholds. At 120, a plurality of thresholds is acquired. The plurality of thresholds may be acquired by accessing a table or other form of database in which these thresholds may be stored. Such tables or databases may be reside in the apparatus or system performing the decoding or may reside external to such an apparatus or system.

The plurality of thresholds may be realized as a threshold table in various embodiments. The following table is a non-limiting example of entries for a few codes and SNR values that may populate a threshold table:

EG(255,175) Construction: LDPC codes based on Euclidian geometries,
  Length: 255, Message length: 175 (See, Y. Kou, S. Lin, and Marc P. C. Fossorier. Low-Density Parity-Check Codes Based on Finite Geometries: A Rediscovery and New Results, IEEE Transactions on Information Theory, 47(7), November 2001.)
Eric(2000,1600) Construction: LDPC code from Bo Xia construction,
  Length: 2000, Message length: 1600 (See, Eric Jacobsen, Intel LDPC Code Technical Description, Oct. 27, 2003, V0.01)
Infenion(2400,1800) Construction: LDPC code, Infenion construction,
  Length: 2400, Message length: 1800 (A technical presentation by Infenion Technologies.)
PEG(504,252) Construction: LDPC code obtained by Progressive Edge
  Growth algorithm, Length: 504, Message length: 252 (See, X.-Y. Hu, E. Eleftheriou, D.-M. Arnold. Regular and Irregular Progressive Edge-Growth Tanner Graphs. IBM Research, Zurich Research Laboratory, 2003.)
RS(2048,1649) Construction: LDPC code from Reed-Solomon codes with 2 information symbols, Length: 2048, Message length: 1649 (See, I.
  Djurdjevic, J. Xu, K. Abdel-GhaRar, and S. Lin, A Class of Low-Density Parity-Check Codes Constructed Based on Reed-Solomon Codes With Two Information Symbols. IEEE Communications Letters, 7(7), July 2003.)
Vand (1000, 757) Construction: LDPC code based on Vandermondematrix
  and cyclic permutation blocks, Length: 1000, Message length: 757 (See, E. Krouk et al. 10 G Ethernet. Technical report, Intel Nizhny Novgorod, Lab, March 2004).

These LPDC code constructions are provided as examples, where such type of code constructions can be understood by those skilled in the art.

In an embodiment, for each value of SNR and each code construction, the threshold has one value, typically applied to at least the first iteration of a decoding scheme, where at least one additional fixed value of the threshold is provided in the decoding scheme. The additional fixed value may be zero for the second iteration and subsequent iterations of the decoding scheme. Alternatively, a threshold table may include a number of entries for a channel parameter, and for each entry for the channel parameter, the threshold parameter may include a

| SNR | EG(255, 175) | Eric(2000, 1600) | Infenion(2400, 1800) | PEG(504, 252) | RS(2048, 1649) | Vand(1000, 757) |
|---|---|---|---|---|---|---|
| 2.00 | −1.703209 | −1.013369 | −1.473104 | −2.696182 | −0.830832 | −0.918977 |
| 2.25 | −1.797118 | −1.049672 | −1.539172 | −2.738346 | −0.869202 | −0.960916 |
| 2.50 | −1.919731 | −1.096213 | −1.598608 | −2.873956 | −0.896573 | −0.987151 |
| 2.75 | −2.035528 | −1.121660 | −1.686542 | −2.973981 | −0.951840 | −1.025731 |
| 3.00 | −2.147337 | −1.170183 | −1.754481 | −3.105872 | −1.003469 | −1.069663 |
| 3.25 | −2.283049 | −1.209998 | −1.818938 | −3.250985 | −1.069735 | −1.123508 |
| 3.50 | −2.440478 | −1.250196 | −1.913103 | −3.353540 | −1.150105 | −1.180198 |
| 3.75 | −2.623968 | −1.297393 | −2.004750 | −3.489512 | −1.237858 | −1.229442 |
| 4.00 | −2.804447 | −1.352606 | −2.083417 | −3.634091 | −1.330557 | −1.304540 |
| 4.25 | −2.999468 | −1.397764 | −2.167832 | −3.753314 | −1.433518 | −1.354703 |
| 4.50 | −3.205640 | −1.441435 | | −3.866233 | −1.546978 | −1.419868 |

In this table, the numbers in parenthesis represent the code length and message length, respectively. The following provides a list of the codes in the above table:

plurality of values of the threshold, where an indicator or indicators are provided that signify during which iteration a particular threshold value is used. Associated with the threshold table is a value for the maximum number of iterations to be used before determining that the codeword is not to be decoded. Such a table may also include a number of different channel parameters, where the values for each channel parameter have its associated plurality of threshold values.

The thresholds for a multi-threshold decoder are not constant, but depend on various parameters such as the channel signal to noise ratio (SNR), the code construction, and the code length. For each codeword construction and code length, a separate set of fixed thresholds may be selected. Each type of code implemented may have its own set of fixed thresholds. In an embodiment, the codeword may be realized as a low density parity check (LDPC) codeword. In an embodiment, the set of fixed thresholds may be determined by simulating a multi-threshold decoder. In an embodiment, the operation of a multi-threshold decoder is simulated with respect to a channel parameter. The channel parameter may be a SNR. In an embodiment, the channel parameter may be a noise dispersion. The set of channel parameters may be a set of standard deviations correlated to channel parameters. Other statistical variations in a simulated channel may be implemented to determine thresholds for the decoding process.

In an embodiment, the operation a multi-threshold decoder to an AWGN channel is simulated with respect to a selected channel parameter. In an embodiment, for some SNR, the simulation provides multiple thresholds to perform the decoding. An average value of the thresholds used in the simulation decoding may be calculated. A threshold table may be formed having entries for different values of SNRs or different noise dispersions. The threshold table is not limited to different values of SNRs or noise dispersions, but may be based on other channel parameters. The threshold table may contain multiple values of a decoding threshold for each value of the channel parameter. Each of the multiple values of the threshold may be assigned to specific iterations of the decoding scheme to decode the codeword. The subsequent use of the threshold table to iteratively decode a codeword received in the communication channel provides a set of fixed values for the multiple thresholds to a multi-threshold decoder. Determining the set of multiple thresholds for each value of a channel parameter is not limited to a simulation process. Other processes may be implemented to determine the set of multi-valued thresholds.

At 130, a codeword is received from a communication channel. The codeword may be embedded in a signal propagating in the communication channel. The codeword may represent information that is transmitted in a communication channel, where the information is encoded or converted to codewords to be transmitted in the communication channel. The use of codewords to transmit information allows for the application of error correction methods to the transmission of the information. The communication channel may be an integral part of a larger communication network or a channel in an apparatus that implements high speed data transmission.

At 140, the plurality of thresholds is used to iteratively decode the codeword. Decoding of codewords may be implemented using multiple values for a threshold in the decoding scheme in which the multiple values are selected from the plurality of thresholds. These thresholds have fixed values, which have been determined before decoding the codeword. In an embodiment, the thresholds are selected prior to receiving the codeword. In an embodiment, the decoder may select the plurality of thresholds may selecting one value of a threshold to be used in one or more iterations with another value of the threshold fixed by the decoding scheme.

Figure 2:
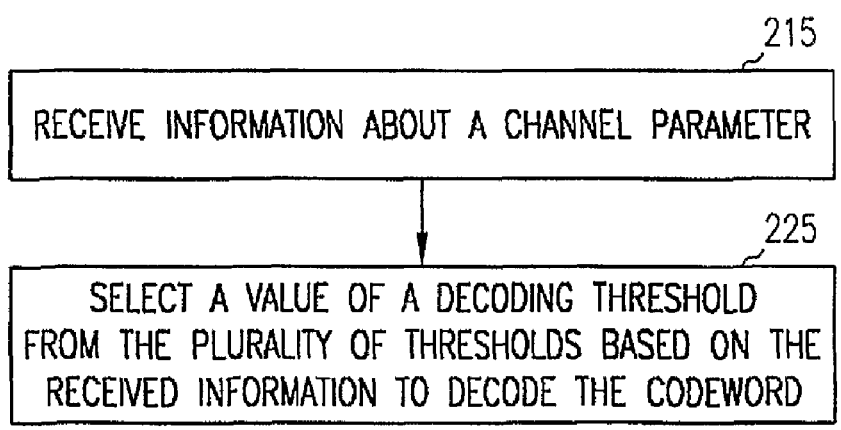
FIG. 2 shows a flow diagram of an embodiment of a method for selecting multiple thresholds to iteratively decode information received from a communication channel.

FIG. 2 shows a flow diagram of an embodiment of a method for selecting multiple thresholds to iteratively decode information received from a communication channel. At 215, information is received in a decoder about a parameter of the channel through which signals containing codewords propagate. The information may provide one or more of a variety of properties such as the SNR or the noise dispersion of the channel. The parameter information may be set in the decoder when the communication channel is constructed. In an embodiment, a parameter of the channel is estimated on a periodic basis and its status provided to a decoder. In an embodiment, a parameter of the channel is estimated on a continual basis and its status is provided to a decoder. Alternatively, the arrival of a signal may automatically initiate sending the parameter information to the decoder. At 225, based on the received information, multiple values for the threshold may be selected from a table, or database, of thresholds to decode the codewords in the received signals. The table or database may be accessed internal or external to the decoder. The values may be selected by querying the table or database prior to receiving the signals. The query may be conducted when the signal arrives. This plurality of decoding thresholds selected from the plurality of thresholds having predefined values calculated before decoding a codeword may be provided to a multi-threshold decoder for decoding.

Figure 3:
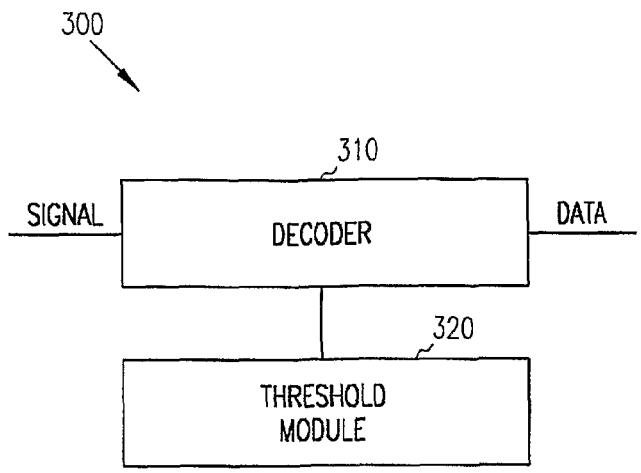
FIG. 3 shows a block diagram of an embodiment of an apparatus having a decoder and threshold module to iteratively decode information using fixed multiple thresholds.

FIG. 3 shows a block diagram of an embodiment of an apparatus 300 having a decoder 310 and threshold module 320 to iteratively decode information using fixed multiple thresholds. Decoder 310 receives a signal from a communication channel and a set of multiple thresholds from threshold module 320 to decode codewords in the signal to provide data. The set of multiple thresholds are fixed before decoder 310 begins decoding the signal. The set of multiple thresholds may include multiple thresholds for each value of a parameter characterizing the channel in which the signal propagates.

Threshold module 320 may be coupled to decoder 310 or may be constructed as an integral part of decoder 310. In an embodiment, threshold module 320 contains a threshold tables or a threshold database to store the predetermined threshold value values. These threshold values may be provided to threshold module 320 from an external system that determines threshold values for one or more channel parameters such as for multiple values of a SNR or a noise parameter. In an embodiment, the eternal system is arranged to simulate a multi-threshold decoder based on a channel parameter. The channel parameter may include the SNR or noise parameter of a communication channel modeled to carry the signal. In an embodiment, threshold module 320 is adapted to determine the multiple thresholds for multiple values of a channel parameter such as a SNR, a noise dispersion, or a mean noise variance. Threshold module 320 may be configured to use simulation techniques in such a determination procedure. The simulation may be modeled as operation of a multi-threshold iterative decoder operating on an AWGN channel.

Figure 4:
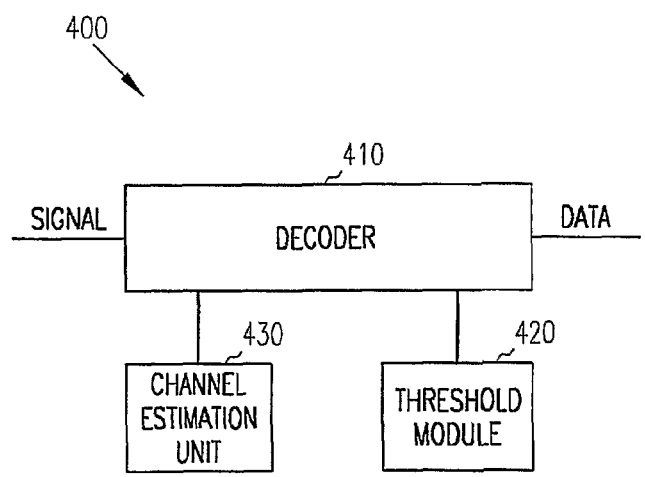
FIG. 4 shows a block diagram of an embodiment of an apparatus having a channel estimation unit to provide information to a decoder to select multiple thresholds to iteratively decode information.

FIG. 4 shows a block diagram of an embodiment of an apparatus 400 having a channel estimation unit 430 to provide information to a decoder 410 to select multiple thresholds to iteratively decode information. Decoder 410 receives a signal from a communication channel and a set of multiple thresholds from a threshold module 420 to decode codewords in the signal to provide data. Decoder 410 may be realized as an embodiment decoder 310 of FIG. 3. Additionally, threshold module may be realized as an embodiment of decoder 320 of FIG. 3. The set of multiple thresholds are fixed before decoder 410 begins decoding the signal. The set of multiple thresholds may include multiple thresholds for each value of a parameter characterizing the channel in which the signal propagates.

The parameter characterizing the channel may be provided to decoder 410 from channel estimation unit 430.

Channel estimation unit 430 may be coupled to decoder 410 or configured as an integral part of decoder 430. In an embodiment, channel estimation unit 430 collects information on one or more characterizing parameters of the communication channel in which the signal is propagating without being in the signal path to decoder 410. Alternatively, the signal may propagate through channel estimation unit 430 to decoder 410. In an embodiment, channel estimation unit 430 may be adapted to estimate channel parameters on a periodic basis. Channel estimation unit 430 may be adapted to estimate channel parameters on an almost continual basis.

Figure 5:
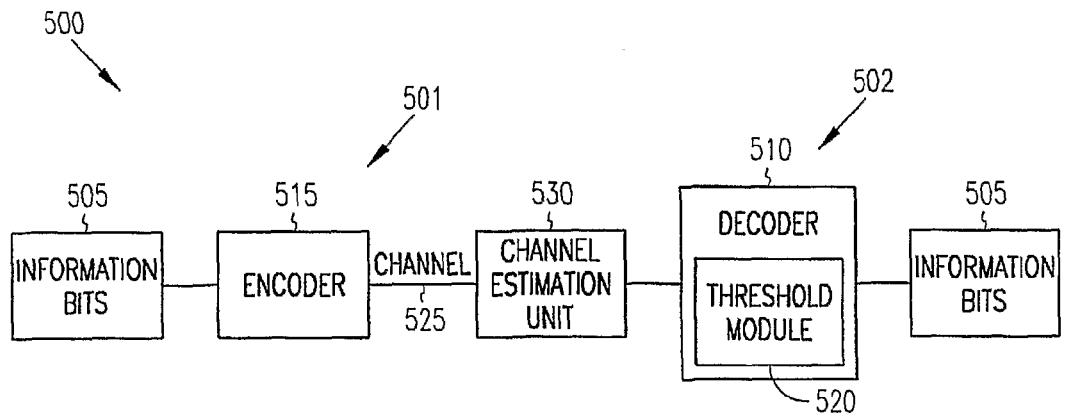
FIG. 5 illustrates a block diagram of an embodiment of a network in which information is encoded at one end of a channel and decoded at another end of the channel.

FIG. 5 illustrates a block diagram of an embodiment of a network 500 in which information is encoded at one end of a channel 525 and decoded at another end of channel 525. Network 500 includes system 501 in communication with system 502 through channel 525. Data is provided as information bits 505 to an encoder 515. Encoder 515 is adapted to encode information bits 515 and send the encoded information in a signal onto channel 525. Encoder 515 may be adapted to encode the information bits to match a code construction and codeword length expected a decoder 510 of system 502.

System 502 includes a channel estimation unit 530 and a threshold module 520 in addition to decoder 510 to decode the signal from channel 525 to provide the information bits 505 at system 501 originating from system 501. Optionally, threshold module 520 may be realized as an integral part of decoder 510. In an embodiment, the communication between system 501 and system 502 is bi-directional. System 501 may include a decoder, a threshold module, and a channel estimation unit configured in an embodiment as in system 502. Likewise, system 502 may include an encoder in an embodiment as in system 502.

In an embodiment, a communication network 500 of FIG. 5 includes a system 501 for encoding a low-density parity check (LPDC) codeword and a system 502 for decoding a version of the encoded LDPC codeword received from communication channel 525. Communication channel 525 may include, but is not limited to, a fiber optic channel, a wired channel, a channel reading data stored on a memory unit, or a wireless channel. Additionally, embodiments for decoding and encoding may be adapted for use with any protocol for transmission over any communication channel.

Various embodiments for communication network 500, system 501, and system 502 may be realized. System 501, 502 may be arranged as network nodes 501, 502, respectively, where each node may represent processing systems having a physical layer (PHY) entity arranged to operate in accordance with 10 GBase-T as defined by the IEEE 802.3 an series of standards, for example. The 10 GBase-T PHY may interface with, for example, a 10 G media access control (MAC) and Gigabit Media Independent Interface (XGMII) in an IEEE architecture. The 10 GBase-T PHY may include part of a network interface card (NIC), for example. Network nodes 501, 502 may include any processing system and/or communications device suitable for use with a 10 GBase-T device. For example, network nodes 501, 502 may be implemented as a pair of switches, a pair of routers, a pair of servers, a switch and a router, a switch and a server, a server and a router, and so forth. In addition, network nodes 501, 502 also may be part of a modular system in which 10 GBase-T is the high-speed connection for the system. In an embodiment, each of network nodes 501, 502 may include a host system. In an embodiment, network nodes 501, 502 may include a host system, where the host system is configured as a single host system for both network nodes 501, 502. Further examples for network nodes 501, 502 may include high-end servers, supercomputers, clusters, grid computing, workgroup switch uplinks, aggregation uplinks, storage systems, and so forth. The embodiments are not limited in this context.

Communication network 500 may be a land based network using optical fibers, coaxial cable, or wires as a medium for the communication channels between various nodes of communication network 500. Communication network 500 may be realized as a wireless network in which systems 501 and 502 are configured as part of a node of communication network 500 or as part of a wireless receiving device that receives signals from the nodes of communication network 500. Systems 501 and system 502 may be configured as part of, but not limited to, network components such as base stations and may be configured as part of, but not limited to, wireless receiving devices such as handheld communication devices, computers, and laptop computing devices. Though not shown, systems 501 and 502 configured in a wireless communication system 500 include antennas for transmitting and receiving signals that include one more codewords. The decoding and encoding schemes and apparatus do not limit the type or configuration of supporting components such as antennas in the 501, 502 systems. In an embodiment, a substantially omnidirectional antenna is utilized.

Each node of communication network 500 configured as a land based network or as a wireless based network may contain a version of system 501 and/or a version of system 502 or a system that is a combination of system 501 and system 502. Additionally the decoding and encoding processes used in the encoders and decoders of systems 501 and system 502 and other embodiments for decoding and encoding processes and apparatus as described herein may be adapted for the communication standards and protocols used in communication network 500.

Figure 6:
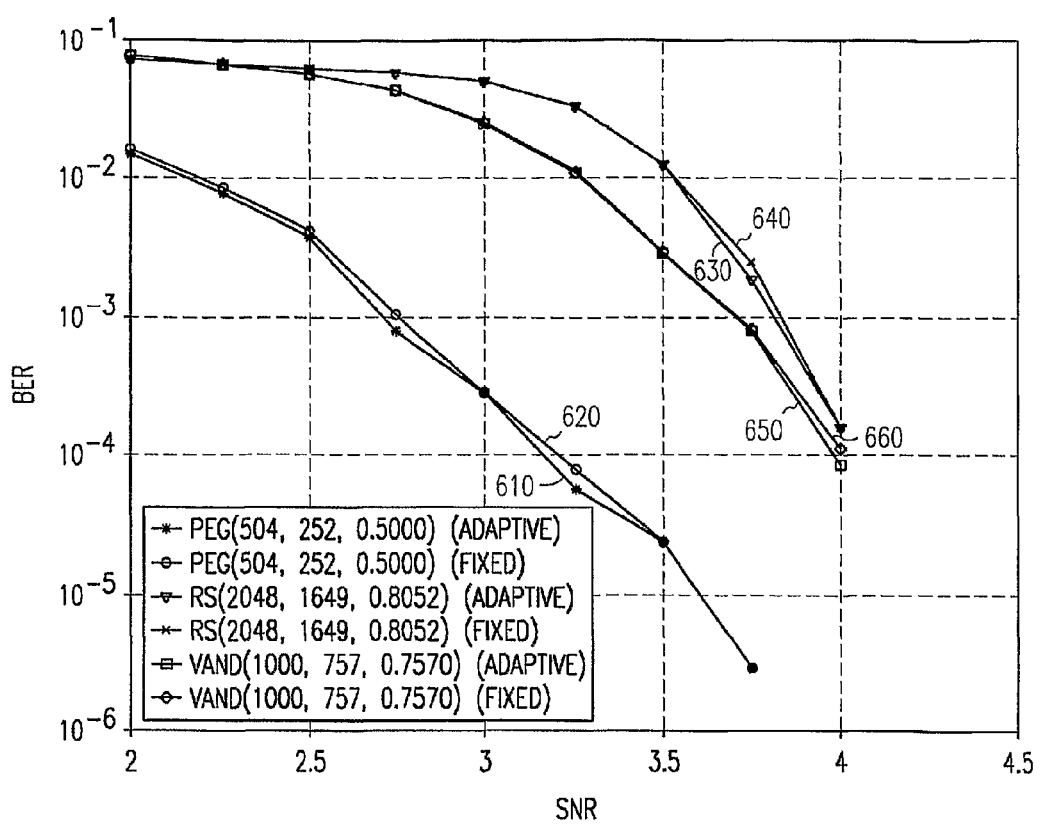
FIG. 6 shows a comparison of embodiments using fixed multiple thresholds and using adaptive multiple thresholds for decoding various codes.

FIG. 6 shows a comparison of embodiments using fixed multiple threshold and using adaptive multiple thresholds for decoding various codes. The code constructions shown are adaptive PEG code 610, fixed PEG code 620, adaptive RS code 630, fixed RS code 640, adaptive Vand code 650, and fixed Vand code 660, where the code length is the first parameter, the message length is the second parameter, and the third parameter is the code rate indicated in parenthesis. The code rate is the message length divided by the code length. FIG. 6 plots the decoding error in bit-error rate (BER) for the different constructions using a multi-threshold decoder with adaptive thresholds and fixed thresholds as a function of SNR. FIG. 6 indicates that the usage of fixed thresholds determined for an AWGN channel does not lead to increasing error probability as compared to an arbitrary channel using adaptive selection of thresholds during decoding.

Figure 7:
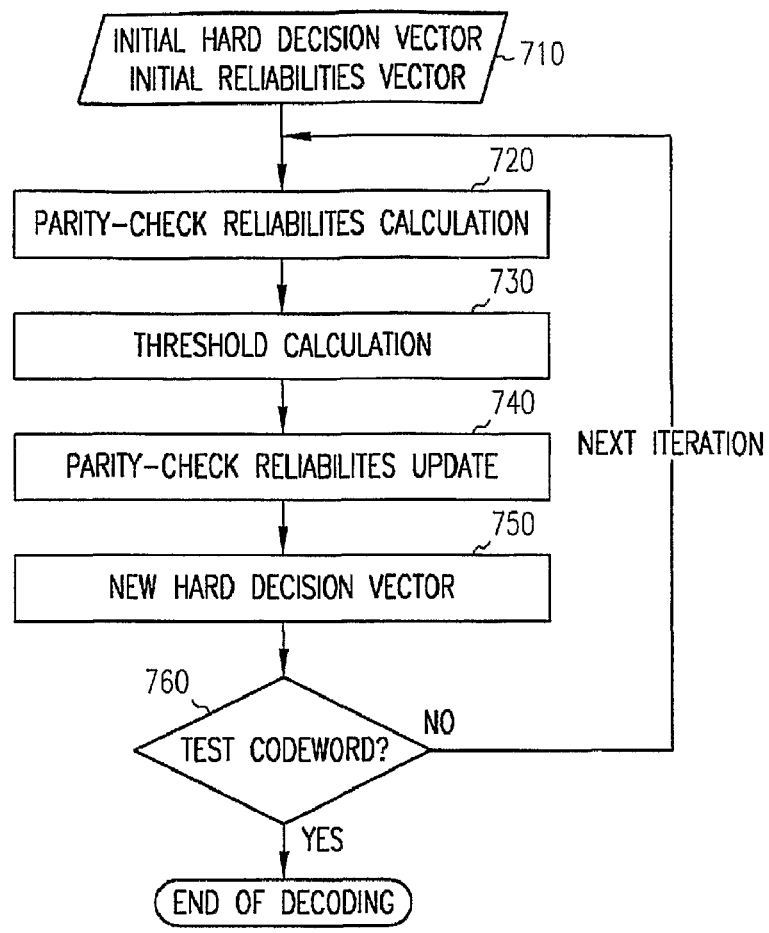
FIG. 7 illustrates a flow diagram of an embodiment of a method that can be used in a simulation to determine fixed thresholds for an LDPC decoder.

FIG. 7 illustrates a flow diagram of an embodiment of a method that can be used in a simulation to determine fixed thresholds for a multiple threshold LDPC reliability decoder. Low-density parity check codes provide a powerful forward error correcting tool in high-speed communication systems due to the low decoding complexity and the bit-error rate achieved in an additive white Gaussian noise channel. Conventional LDPC decoders work using a one-threshold decoding scheme.

LDPC codes use a parity check matrix, H, containing mostly zeros and a limited number of ones. A binary $(n, \gamma, \rho)$ LDPC code has a codeword length, or block length, of n bits and a parity check matrix with exactly $\gamma$ ones in each column and exactly $\rho$ ones in each row. In the LDPC code, each code bit is checked by $\gamma$ parity checks and each parity check uses p code bits. Further, the code has a rate, R, defined as R=k/n, where k is the number of message (information) bits in the codeword having n bits.

A simulation of an iterative decoding process applied to a test codeword may include checking as to whether or not the parity check equation for each simulated received bit from a simulated channel is satisfied. If all the parity check equations are satisfied, the simulated received bits are taken to be the simulated codeword transmitted. If the majority of parity check equations for a given simulated received bit are not satisfied, the given received bit may be flipped; otherwise the value of the given received bit is maintained. Flipping a bit means changing a zero to a one or a one to a zero. After the simulated received codeword is reconstructed with the flipping of a bit, the parity check equations are again checked. If all the parity check equations are satisfied, the received bits are taken to be the simulated codeword transmitted, otherwise the iterative procedure continues until a maximum number of allowed iterations is reached.

A simulated multi-threshold reliability decoder may be constructed to provide an iterative decoder that uses a soft-decision input vector to generate a hard decision vector and its associated reliabilities vector that describes the absolute likelihood value of every bit. At every iteration, the simulation reliability decoder computes the reliability of every parity check equation using the bit reliabilities. Then, for every bit and every parity check, if a parity check equation failed, the corresponding bit reliability (corresponding to a bit or parity check equation) is decreased; otherwise the bit reliability is increased. When all equations are checked, a hard decision is made using the following rule: if the updated bit reliability is greater than a threshold value, the bit and its reliability stay unchanged, otherwise the bit is flipped (inverted), and its reliability is changed as a function of the updated reliability and threshold value. If the updated reliability is less than 0 but larger than the threshold value at that iteration, then the new bit reliability is set to 0. The threshold value is scheduled to be updated at least once during the decoding process. The process is repeated until the codeword is reconstructed or the decoder reaches the maximum allowed number of iterations.

For each iteration, the threshold values may be calculated. The threshold values are used for making the decisions as to whether a bit and its associated reliability should be updated. If a particular reliability is less than the threshold value, then the hard decision bit associated with the reliability is inverted and its new reliability is assigned to the absolute value of the recalculated reliability. The decoding scheme is iterative, and the thresholds may differ from one iteration to another, where at least two values of the threshold are provided or scheduled for calculation during the decoding process. In another embodiment, at the first iteration the error-decision threshold is set to the smallest of the bit reliabilities, and then, at all other iterations, the error-decision threshold is set to zero. In this embodiment, the multi-threshold decoding scheme would be a decoding scheme using two thresholds.

A soft decision is one in which the likelihood that a bit should represent a one or zero is taken into account when determining the value of the bit from the received signal. Soft decision decoders may use information relating to the confidence of the received signal (soft received information) and knowledge of the properties of the channel to provide probabilistic expressions for a received signal relative to the transmitted signal. The simulated received signal is the test codeword modified by the simulated channel, which may include altering the test codeword based on a channel parameter of the simulated channel. In an embodiment, the channel is taken to have a SNR and the simulated received codeword is one based on the probabilistic influence of the channel having the given SNR on the transmission of the test codeword. The simulated received signal provides the soft-decision input vector for the decoding process.

With respect to the process regarding flipping a received bit discussed above, an initial hard decision is conducted on the simulated signal received from the communication channel. A hard decision is made regarding a bit in the SNR based codeword by evaluating that bit individually. For a hard decision for a binary bit, the decoder makes the bit a 1 or a 0 if the bit is less than or greater than a fixed value set by the simulated reliability decoder. With the fixed value set by the decoder at zero, a hard decision would set a bit equal to 1 if the received signal for the bit is positive and set the bit equal to 0 if the received signal is negative. Alternately, a hard decision may set a bit equal to 1 if the received signal for the bit is negative and set the bit equal to 0 if the received signal is positive.

While a hard decision for a binary process provides a hard decision vector where the vector locations, or vector bits, are either a one or a zero, a soft decision may provide a hard decision vector and a reliabilities, or bits reliabilities, vector. The binary hard decision vector provided by the soft decision is a vector of ones and zeros, where each vector bit is generated individually with respect to a fixed criteria. The reliabilities vector includes a set of bit reliabilities, each bit reliability corresponding to a bit of the associated hard decision vector. The bit reliability provides a measure of its confidence of the corresponding bit in the hard decision vector. The bit reliability may take the form of a probability, a log-likelihood ratio, or other weighted factor correlated to the communication channel through which a received codeword is transmitted. A bit reliability may be correlated directly to the magnitude of the signal representing a received bit.

At 710, an initial hard decision vector and an initial reliabilities vector are constructed for a simulated received codeword constructed using a given SNR value. For the simulated received codeword, $Y=(Y_1, Y_2, \ldots Y_n)$, let $N(m)$ be the set of codeword positions that are used in an $m^{th}$ parity check: $N(m)=\{n:H_{m,n}=1\}$, where H is a parity check matrix and $H_{m,n}=1$ means the value of the H matrix at the m,n position equals one. Further, let $M(n)$ be the set of parity checks that includes $n^{th}$ codeword position: $M(n)=\{m:H_{m,n}=1\}$.

At initialization, for every element, $Y_i$, of the simulated received vector, a hard decision $X_i$ and a bit reliability $R_i$ are computed. The bit reliability $R_i$ is set to the absolute value of $Y_i$. The hard decision may set $X_i$ equal to one if $Y_i$ is greater than zero, and $X_i$ equal to zero if $Y_i$ is less than or equal to zero. For every m 0 M(n), a parity check bit reliability is defined as $Y_{mn}$, where initially $Y_{mn}=R_n$, and an associated hard decision is defined as $X_{mn}$, where initially $X_{mn}=X_n$.

After the initialization, at 720, an iterative process begins with performing a parity check reliabilities calculation. In an embodiment, for each n and each m 0 M(n), check sums, $S_{mn}$ are calculated as:

$S_{mn}=X_n \oplus \Sigma X_{mn'}$ mod 2, where the summation is over n' 0 N(m)\n. An expression N(m)\n means a set N(m) where bit n is excluded. A value for the minimum of $Y_{mn}$ is identified as:

$Y_{mn\ min}=\min\{Y_{mn'}\}$ for n' 0 N(m)\n.

At 730, a threshold is calculated. In an embodiment, the threshold is set to the minimum value, over all n, of the set of an updated bit reliabilities defined for each n as, $Z_n = R_n + \Sigma(-1)^{S_{mn}} Y_{mn\ min}$ for m 0 M(m).

These updated bit reliabilities will also act as comparison reliabilities in the decoding process. In an embodiment, the multi-value threshold is provided by computing a value for the threshold during each iteration of the simulated decoding process.

In an embodiment, the thresholds are selected in the simulation process for multiple operating modes for decoding. In one mode, the decoding corrects one or two errors. In this mode, the decoding process does not insert additional errors in a codeword vector. In another mode, the decoding process corrects more than one error in one iteration, and may correct one to two errors in a subsequent iteration.

At 740, parity check bit reliability updating is performed. A set of comparison reliabilities are computed with contribution from the parity check reliabilities, which can be viewed as parity check voting. For each n and each m 0 M(n), $Z_{mn}$ is defined as $$Z_{mn} = R_n + \Sigma(-1)^{S_{m'n}} Y_{m'n \, min} \text{ for } m' \, 0 \, N(n) \backslash m.$$

For each n, the parity check bit reliabilities are updated as are the associated hard decisions $X_{mn}$ based on the comparison reliabilities, $Z_{mn}$. Updating a reliability or a hard decision includes maintaining the value of the reliability or the hard decision, if the comparison indicates that the reliability or the hard decision should remain the same.

$$Y_{mn} = \begin{cases} Z_{mn}, & Z_{mn} > 0 \\ -Z_{mn}, & Z_{mn} < \text{threshold} \\ 0; & \text{otherwise} \end{cases}$$

$$X_{mn} = \begin{cases} X_{mn}, & Z_{mn} > \text{threshold} \\ 1 - X_{mn}, & Z_{mn} < \text{threshold} \end{cases}$$

At 750, a new hard decision vector, C, is generated based on the comparison reliabilities, or updated bit reliabilities, $Z_n$ as $$C_i = \begin{cases} X_i, & Z_i > 0 \\ 1 - X_i, & Z_i < 0. \end{cases}$$

Updating a bit includes maintaining the value of the bit, if the comparison indicates that the bit should remain the same. The terms $C_i$ provide the bits of a sample codeword to determine if a valid codeword has been generated. At 760, the sample codeword is evaluated for validity. If the following relation occurs, $$CH^T \neq 0,$$

the iterative process returns to 720 using the updated parity check reliability values.

An embodiment of a simulation method for iteratively decoding an LDPC codeword using a threshold having multiple values includes having the threshold take on only two values during the iteration process. A first value is set at the minimum of the updated reliabilities, $Z_n$, for the $Z_n$ generated in the first iteration prior to making decision comparisons. A second value is set at a fixed value, such as zero, for subsequent iterations. In an embodiment, the multi-value threshold may be provided by computing a value for the threshold during the first iteration using updated bit reliabilities and using that value for the first half of the total number of iterations, and, then, using a fixed value, such as zero, for the last half of the total iterations.

In the various embodiments for simulating a decoder, the number of iterations may be taken to be $\log_2 n$, where n is codeword length. This provides a maximum number of iterations to perform before terminating the iteration prior to reconstructing a simulated valid codeword. The calculated thresholds may be placed in a threshold table, if a valid test codeword, or test vector, is determined within the maximum number of iterations.

After the multiple thresholds are determined for a given SNR, another test codeword may be simulated and multiple values of the threshold may be determined. With a number of simulations performed for a given SNR, the values of the threshold for each iteration can be averaged. The averaged values of the multiple thresholds may be used as the fixed values to be stored in a medium, such as in a table, for use by a decoder operating in a communication channel. In a two threshold decoder in which one value is set in the decoder to a fixed value, such as zero, the table entry for the given SNR may have one entry. After the multiple thresholds after determined for the given SNR, a new value of the SNR is generated and the simulation process is repeated to generate the multiple thresholds for the new value of the SNR and enter the results in the thresholds table. Such a simulation process may be conducted for each possible code construction that may be used in the active communication channel. The resulting thresholds table may have indexed threshold values for a given SNR, where the index identifies the code construction. Alternatively, the thresholds table may be a set of threshold tables, one for each code construction.

Various embodiments or combinations of embodiments for apparatus and methods for decoding and encoding communication signals using a fixed multiple-threshold scheme, as described herein, can be realized in hardware implementations, software implementations, and combinations of hardware and software implementations. These implementations may include a computer-readable medium having computer-executable instructions for performing a decoding and/or encoding method using an embodiment for a scheme using multiple thresholds for iterative decoding, where the multiple thresholds are fixed prior to decoding. The computer-readable medium is not limited to any one type of medium. The computer-readable medium used will depend on the application using an embodiment of the multiple threshold scheme. In an embodiment, a processor coupled to a receiver and/or transmitter may utilize the computer-readable medium and various forms of memory to direct decoding and/or encoding of information for data transmission. In an embodiment, the memory may store parameters used to iteratively decode the received codeword.

Figure 8:
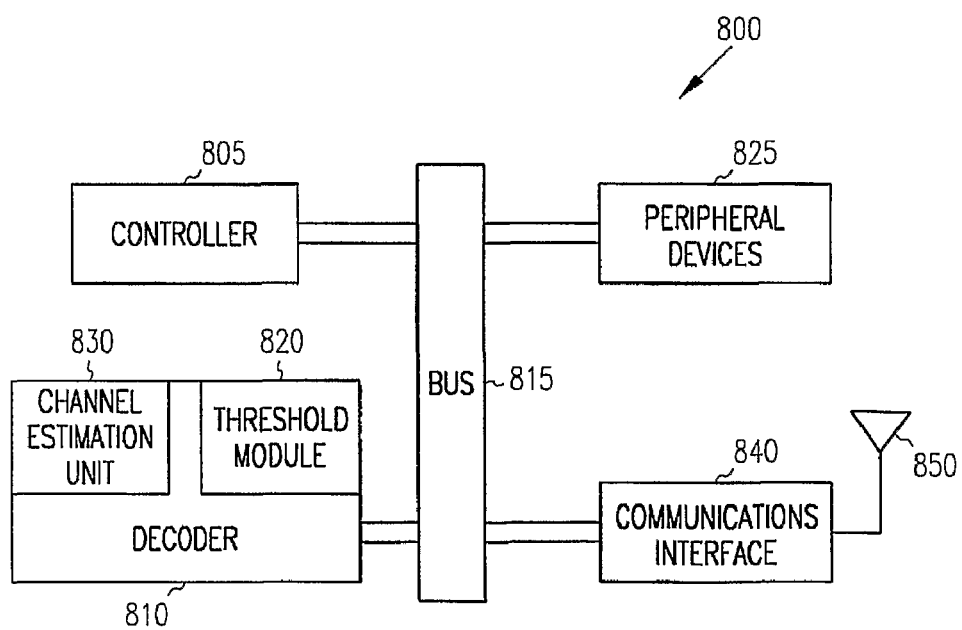
FIG. 8 illustrates a block diagram of an embodiment of a system having a decoder to iteratively decode a codeword using fixed multiple thresholds.

FIG. 8 illustrates a block diagram of an embodiment of a system 800 having a decoder 810 to iteratively decode a codeword using fixed multiple thresholds. System 800 may include an encoder to encode information to be transmitted to a receiving entity that iteratively decodes a codeword using fixed multiple thresholds to provide the information at the receiving entity. System 800 includes a controller 805, decoder 810, and a bus 815, where bus 815 provides electrical conductivity between controller 805 and decoder 810, and between controller 805 and a communication interface 840. An embodiment may include an additional peripheral device or devices 825 coupled to bus 815. Bus 815 may be compatible with Peripheral Component Interconnect (PCI) or with PCI express. In an embodiment, communication unit 840 may include a network interface card. In an embodiment, communication unit 840 may a communications device suitable for use with a 10 GBase-T device. In a wireless embodiment, communication interface 840 is coupled to an antenna

850. In an embodiment, antenna 850 may be a substantially omnidirectional antenna. Communication interface 840 may be coupled to an optical fiber medium or an optical fiber network. Communication interface 840 may be couple to a coaxial cable medium. Electronic system 800 may include, but is not limited to, information handling devices, wireless systems, telecommunication systems, fiber optic systems, electro-optic systems, and computers.

Decoder 810 may be realized with a hardware architecture, a software based architecture, or combination of hardware/software architecture. Decoder 810 includes a threshold module 820 and a channel estimation unit 830. Threshold module 820 provides fixed multiple-thresholds to decoder 810 to decode data received by system 800. Threshold module 820 may be configured as a storage medium to store plurality of thresholds. Such a storage medium may be realized as one or more thresholds tables to be accessed by decoder 810 to select one or more thresholds. Threshold module 820 may also be adapted automatically provide select thresholds to decoder 810 upon the arrival of a signal to system 800. The plurality of thresholds may be constructed exterior to threshold module 820 and supplied to threshold module 820. Alternatively, threshold module 820 may include a simulation unit or other threshold determining mechanism to construct the plurality of thresholds at a time prior to system 800 receiving a signal to be decoded.

Channel estimation unit 830 monitors the communication channels on which system 800 communicates to determine one or more channels parameters characterizing the transmission properties of the communication channels. The channel parameters may include SNR, noise dispersion, noise variance, and/or other statistical variations of the communication channels. Channel estimation unit 830 typically operates in a real time basis to provide channel information that is accurate for signals that are being received and decoded. Channel estimation unit 830 may be adapted to work with an adaptive communication network An adaptive communication network automatically uses feedback information obtained from the network itself or from the signals carried by the network to modify dynamically one or more of the network operational parameters to improve network performance or to resist degradation. Working with an adaptive communication network, channel estimation unit 830 may update its determination of channel parameters on a frequent basis. In an embodiment, system 800 is a communication network, such as a computer or other electronic device in which high speed data is transported throughout the device on its device buses, with bus 815 providing communication channels.

Either or both channel estimation unit 830 and threshold module may be located outside decoder 810. In a configuration exterior to decoder 810, channel estimation unit 830 and/or threshold module 820 may be coupled directly to decoder 810. Alternatively, channel estimation unit 830 and/or threshold module 820 may be coupled to decoder 810 by bus 815 or other routing device.

In an embodiment, controller 810 is a processor. Peripheral devices 825 may include displays, memory, or other control devices that may operate in conjunction with controller 810, communication interface 840, and/or decoder 810. In an embodiment, peripheral devices 825 include a means, such as a simulation decoder, to generate the plurality of thresholds for threshold module 820.

Embodiments of methods, apparatus, and systems using an embodiment of a fixed threshold selection scheme decrease decoder complexity by usage of fixed thresholds. Further, a channel estimation unit may be adapted to provide usage information regarding values of channel parameters to the decoder, which gives additional information to decoder, increasing the decoder performance. By using a channel estimation unit, the thresholds are selected accurately, while use of the predetermined values of the threshold does not cause an increase in error probability. Usage of predefined thresholds table allows quick selection of thresholds that depend on channel conditions, which increases decoding speed without quality loss compared to an adaptive thresholds selection scheme.

Embodiments for a multiple-threshold decoding scheme may be adapted to be used in any system operating with a communication channel. Such embodiments may be used with an Ethernet channel including a wireless Ethernet channel. The communication channel may be part of a land based communication network or a wireless communication network. Indeed, embodiments of the present invention may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan are network (WMAN), a wireless wide area network (WWAN), a cellular network, a third generation (3 G) network, a fourth generation (4 G) network, a universal mobile telephone system (UMTS), and similar communication systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
    acquiring a plurality of thresholds in a device under direction of a processor of the device;
    receiving a codeword from a communication channel; and
    iteratively decoding the codeword in a decoder of the device using the plurality of thresholds, wherein the plurality of thresholds are determined before decoding the codeword such that using each threshold includes using each threshold to make a decision, under control of the decoder, as to whether or not to update a bit and its associated reliability during the iterative decoding.

2. The method of claim 1, wherein acquiring a plurality of thresholds includes determining the thresholds with respect to a channel parameter.

3. The method of claim 2, wherein determining the thresholds with respect to a channel parameter includes determining the thresholds for multiple values of the channel parameter.

4. The method of claim 2, wherein determining the thresholds with respect to a channel parameter includes determining the thresholds for a signal to noise ratio.

5. The method of claim 2, wherein determining the thresholds with respect to a channel parameter includes determining the thresholds for a noise dispersion.

6. The method of claim 1, wherein using the plurality of thresholds to iteratively decode the codeword includes:
receiving information about a channel parameter; and
selecting a value of a decoding threshold from the plurality of thresholds based on the received information to decode the codeword.

7. The method of claim 1, wherein acquiring a plurality of thresholds includes acquiring the plurality of thresholds before receiving the codeword.

8. The method of claim 1, wherein decoding the codeword includes decoding a low-density parity check codeword.

9. A method comprising:
acquiring a plurality of thresholds, wherein acquiring a plurality of thresholds includes determining the thresholds with respect to a channel parameter;
receiving a codeword from a communication channel; and
using the plurality of thresholds to iteratively decode the codeword in a decoder, wherein the plurality of thresholds are determined before decoding the codeword, wherein determining the thresholds with respect to a channel parameter includes simulating a multi-threshold decoder to determine the thresholds with respect to the channel parameter.

10. The method of claim 9, wherein simulating a multi-threshold decoder includes simulating operation of the multi-threshold decoder to an additive white Gaussian noise channel.

11. A computer-readable medium that stores instructions, which when performed by a machine, cause the machine to:
acquire a plurality of thresholds in the machine under direction of a processor of the machine;
receive a codeword from a communication channel; and
iteratively decode the codeword in a decoder of the machine using the plurality of thresholds, wherein the plurality of thresholds are determined before decoding the codeword such that using each threshold including using each threshold to make a decision, under control of the decoder, as to whether or not to update a bit and its associated reliability during the iterative decoding.

12. The computer-readable medium of claim 11, wherein to acquire a plurality of thresholds includes accessing the plurality of thresholds from a storage medium.

13. The computer-readable medium of claim 11, wherein to acquire a plurality of thresholds includes determining the thresholds for multiple values of a channel parameter.

14. The computer-readable medium of claim 11, wherein to decode the codeword includes decoding a low-density parity check codeword.

15. The computer-readable medium of claim 11, wherein the computer-readable medium is adapted to operate in an optical system.

16. The computer-readable medium of claim 11, wherein the computer-readable medium is adapted to operate in a wireless system.

17. A computer-readable medium that stores instructions, which when performed by a machine, cause the machine to:
acquire a plurality of thresholds;
receive a codeword from a communication channel; and
use the plurality of thresholds to iteratively decode the codeword, wherein the plurality of thresholds are determined before decoding the codeword, wherein to acquire a plurality of thresholds includes simulating a multi-threshold decoder to determine the thresholds with respect to a channel parameter or wherein to use the plurality of thresholds to iteratively decode the codeword includes:
receiving information about a channel parameter; and
selecting a value of a decoding threshold from the plurality of thresholds based on the received information to decode the codeword.

18. The computer-readable medium of claim 17, wherein simulating a multi-threshold decoder to determine the thresholds with respect to a channel parameter includes at least one of determining the thresholds for multiple values of a signal to noise ratio or determining the thresholds for multiple values for a noise dispersion.

19. The computer-readable medium of claim 17, wherein to use the plurality of thresholds to iteratively decode the codeword includes:
receiving information about a channel parameter; and
selecting a value of a decoding threshold from the plurality of thresholds based on the received information to decode the codeword.

20. An apparatus comprising:
a threshold module to acquire a plurality of thresholds; and
a decoder adapted to use the plurality of thresholds to iteratively decode a codeword from a communication channel, the thresholds arranged as fixed values to the decoder, wherein the apparatus includes a channel estimation unit to provide information about a channel parameter, the decoder adapted to select a value of a decoding threshold from the plurality of thresholds based on the information to iteratively decode the codeword or wherein the plurality of thresholds includes multiple values of the thresholds for a number of values of a channel parameter including one or more of a signal to noise ratio or a noise dispersion.

21. The apparatus of claim 20, wherein the apparatus includes a channel estimation unit to provide information about a channel parameter, the decoder adapted to select a value of a decoding threshold from the plurality of thresholds based on the information to iteratively decode the codeword.

22. The apparatus of claim 20, wherein the plurality of thresholds includes multiple values of the thresholds for a number of values of a channel parameter.

23. The apparatus of claim 22, wherein the channel parameter includes one or more of a signal to noise ratio or a noise dispersion.

24. The apparatus of claim 20, wherein the codeword includes a low-density parity check codeword.

25. An apparatus comprising:
a threshold module to acquire a plurality of thresholds; and
a decoder adapted to use the plurality of thresholds to iteratively decode a codeword from a communication channel, the thresholds arranged as fixed values to the decoder, wherein the threshold module is coupled to a simulation unit adapted to simulate a multi-threshold decoder to determine the thresholds with respect to a channel parameter of the communication channel or wherein the threshold module is adapted to simulate a multi-threshold decoder to determine the thresholds with respect to a channel parameter.

26. The apparatus of claim 25, wherein the threshold module is adapted to simulate a multi-threshold decoder to determine the thresholds with respect to a channel parameter.

27. The apparatus of claim 26, wherein the threshold module is adapted to simulate operation of the multi-threshold decoder to an additive white Gaussian noise channel.

28. A system comprising:
a communication interface to receive a signal from a communication channel, the signal containing a codeword;

a threshold module to acquire a plurality of thresholds; and
a decoder adapted to use the plurality of thresholds to iteratively decode the codeword, the thresholds arranged as a fixed values to the decoder, the decoder arranged to use each threshold to make a decision as to whether or not to update a bit and its associated reliability during the iterative decoding of the codeword.

29. The system of claim 28, wherein the communication interface includes a substantially omnidirectional antenna.

30. The system of claim 28, wherein the communication interface includes a network interface card.

31. The system of claim 30, wherein the network interface card includes a 10 GBase-T device.

32. The system of claim 28, wherein the system further includes a host system.

33. The system of claim 32, wherein the host system includes one or more of a computer, a switch, a router, or a server.

34. The system of claim 32, further including a bus to communicatively couple the host system to the communication interface.

35. The system of claim 34, wherein the bus is compatible with Peripheral Component Interconnect (PCI).

36. The system of claim 34, wherein the bus is compatible with Peripheral Component Interconnect (PCI) express.

37. The system of claim 28, wherein the codeword includes a low-density parity check codeword.

38. A system comprising:
a communication interface to receive a signal from a communication channel, the signal containing a codeword;
a threshold module to acquire a plurality of thresholds; and
a decoder adapted to use the plurality of thresholds to iteratively decode the codeword, the thresholds arranged as a fixed values to the decoder, wherein the system includes a channel estimation unit to provide information about a channel parameter, the decoder adapted to select a value of a decoding threshold from the plurality of thresholds based on the information to decode the codeword or wherein the system includes a connection to a simulation unit adapted to simulate a multi-threshold decoder to determine the thresholds with respect to a channel parameter of the communication channel or wherein the threshold module is adapted to simulate a multi-threshold decoder to determine the thresholds with respect to a channel parameter.

39. The system of claim 38, wherein the system includes a connection to a simulation unit adapted to simulate a multi-threshold decoder to determine the thresholds with respect to a channel parameter of the communication channel.

40. The system of claim 38, wherein the threshold module is adapted to simulate a multi-threshold decoder to determine the thresholds with respect to a channel parameter.

* * * * *

UNITED STATES PATENT AND TRADEMARK OFFICE
CERTIFICATE OF CORRECTION

| | |
|---|---|
| PATENT NO. | : 8,015,468 B2 |
| APPLICATION NO. | : 11/664203 |
| DATED | : September 6, 2011 |
| INVENTOR(S) | : Evguenii A. Krouk et al. |

It is certified that error appears in the above-identified patent and that said Letters Patent is hereby corrected as shown below:

In column 17, line 23, in Claim 35, delete "(PCl)." and insert -- (PCI). --, therefor.

In column 17, line 25, in Claim 36, delete "(PCl)" and insert -- (PCI) --, therefor.

Signed and Sealed this
Twenty-ninth Day of November, 2011

David J. Kappos
*Director of the United States Patent and Trademark Office*